(12) United States Patent
Shih

(10) Patent No.: US 7,079,066 B1
(45) Date of Patent: Jul. 18, 2006

(54) D/A CONVERTER

(75) Inventor: Ke-Yan Shih, Taipei (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 11/175,414

(22) Filed: Jul. 6, 2005

(51) Int. Cl.
*H03M 1/78* (2006.01)

(52) U.S. Cl. ............ 341/154; 341/118; 341/120; 341/144

(58) Field of Classification Search ......... 341/154, 341/144, 118, 115, 120, 136, 159
See application file for complete search history.

(56) References Cited

U.S. PATENT DOCUMENTS

| | | | | |
|---|---|---|---|---|
| 3,974,498 A | * | 8/1976 | Knier | 341/115 |
| 4,638,303 A | * | 1/1987 | Masuda et al. | 341/136 |
| 5,703,588 A | * | 12/1997 | Rivoir et al. | 341/159 |
| 6,137,430 A | * | 10/2000 | Lyden et al. | 341/145 |
| 6,337,646 B1 | * | 1/2002 | Hatani et al. | 341/144 |
| 6,583,744 B1 | * | 6/2003 | Bright | 341/145 |
| 6,707,404 B1 | * | 3/2004 | Yilmaz | 341/120 |

* cited by examiner

*Primary Examiner*—Jean Bruner Jeanglaude
(74) *Attorney, Agent, or Firm*—Winston Hsu

(57) ABSTRACT

A D/A converter. The D/A converter comprises a R-2R ladder network and a correction circuit. The R-2R ladder network receives first and second reference voltage terminals and generates an analog voltage at an output terminal in response to a digital input code. The correction circuit, coupled between the first and second reference voltage terminals via a first switch and a second switch respectively, comprises a plurality of R resistors wherein a terminal of one of the R resistors thereof is coupled to the output terminal via a third switch, and the first, second and third switches are turned on in response to the input digital code.

19 Claims, 11 Drawing Sheets

D/A CONVERTER

BACKGROUND

The invention relates to a D/A converter, and more particularly to a R-2R D/A converter.

Data conversion techniques have been in existence for many years, and their use has become widespread. Converters used, such as a digital-to-analog (D/A) converter or an analog-to-digital (A/D) converter, have found homes in applications such as communication systems, consumer and professional audio, and precision measurement devices.

R-2R ladder network, a common approach applied in a D/A converter, uses fewer unique resistor values, thereby avoiding the requirement for several different precise input resistor values in other D/A converters. FIG. 1 shows a conventional n-bit R-2R D/A converter 10, comprising a R-2R ladder network 12 and an operational amplifier 14. The R-2R ladder network 12, coupled to reference voltage terminals, $V_{ref+}$ and $V_{ref-}$, receives an input digital code $b_{IN}=[b_{n-1} \ldots b_1 b_0]$ to generate an analog output voltage $V_{out}$ to the positive input of the operational amplifier 14. The output of the operational amplifier 14, $V_{out}$, is coupled back to the negative input of the operational amplifier 04, wherein the operational amplifier 14 herein functions as a buffer. FIG. 2 shows the R-2R ladder network 12 in FIG. 1. The R-2R ladder network 12 comprises a plurality of series R resistors, parallel 2R resistors, and coupling switches, $S_{n-1} \ldots S_0$. The last of the R resistors is coupled to a 2R terminating resistor 25 and the first R resistor is coupled to the output terminal. The 2R resistors are respectively coupled to the terminals of each series R resistor, wherein the first the 2R resistor is coupled to the output terminal and the last 2R resistor is coupled to the terminating resistor 25. Each coupling switch, $S_{n-1} \sim S_0$, selectively couples one corresponding 2R resistor to the reference voltage terminals, $V_{ref+}$ or $V_{ref-}$, in response to a corresponding digit of the input digital code $b_{IN}=[b_{n-1} \ldots b_1 b_0]$. For example, the coupling switch $S_0$ couples the 2R resistor 21 to the reference voltage terminal Vref+ when $b_0=1$, and $V_{ref-}$ when $b_0=0$. If n=2, $V_{ref+}=1$ (V), and $V_{ref-}=0$ (V), the operation of conventional R-2R ladder networks follows with reference to FIGS. 3A and 3B. FIG. 3A and FIG. 3B show a 2-bit R-2R ladder network 32 with respect to different digital input code. As shown in FIG. 3A, the analog output voltage $V_{out}$ is 0V when the input digital code $b_{IN}=[b_1 b_0]=[00]$. In a similar manner, the analog output voltage $V_{out}$ of FIG. 3B=$(V_{ref+}-V_{ref-})*2R/(2R+2R)+V_{ref-}$ is 0.5V when the input digital code $b_{IN}=[b_1 b_0]=[10]$.

However, element mismatch error in R-2R D/A converters due to manufacturing variation, imperfections in materials, changes in temperature, humidity, degradation and so on, degrades the performance thereof. For example, FIG. 3C shows a 2-bit R-2R ladder network 32 in the presence of element mismatch in the 2R resistor 31 (i.e. the resistance of resistor 31 is (2R+ΔR)). The resistance of the resistor 31 combining the terminating resistor 35 is then R'. When the digital code $b_{IN}=[10]$, the analog output voltage in FIG. 3C is $\{(V_{ref+}-V_{ref-})*(R+R')/[2R+(R'+R)]+V_{ref-}\}$. Assuming R'=1.01R, the element matching ratio between the resistance of the resistor 33 and the resistance seen from node M is 2R/(R+R')=1/1.005, thereby affecting the accuracy of the analog output voltage. Such element mismatching causes non-linearity problem in R-2R D/A converters, impacting both the DNL (Differential non-linearity) and monotonicity, especially when the input digital code is half full swing.

In the previous discussion, a 2-bit R-2R D/A converter is utilized to describe the principle of a R-2R ladder network; however, the operation is the same in a multi-bit R-2R D/A converter, such as a 10-bit R-2R D/A converter. FIG. 4 shows the output DNL of a 10-bit R-2R D/A converter-with 1% element mismatch error. The DNL is less than −1 (dB) when the input digital code is half swing (i.e. the input digital code is 512), where non-monotonic phenomenon exists when the DNL is less than −1 (dB). Further, the conductive resistance of switches in R-2R D/A converters also affects accuracy. Thus, it is desirable to have a R-2R D/A converter to overcome the described problems.

SUMMARY

According to one aspect of the invention, a D/A converter is disclosed. The D/A converter comprises a R-2R ladder network and a correction circuit. The R-2R ladder network receives first and second reference voltage terminals and generates an analog voltage at an output terminal in response to a digital input code. The correction circuit, coupled between the first and second reference voltage terminals via a first switch and a second switch respectively, comprises a plurality of R resistors wherein a terminal of one of the R resistors is coupled to the output terminal via a third switch, and the first, second and third switches are turned on in response to the input digital code.

According to another aspect of the invention, a D/A (digital-to-analog) converter comprises a R-2R ladder network and a correction circuit. The R-2R ladder network receives first and second reference voltage terminals and generates an analog voltage at an output terminal in response to a digital input code. The correction circuit, coupled between the first and second reference voltage terminals via a first switch and a second switch respectively, comprises a plurality of R resistors wherein a terminal of one of the R resistors is coupled to the output terminal via a third switch, and the first, second and third switches are turned on when the input digital code is half swing.

According to another aspect of the invention, a D/A (digital-to-analog) converter comprises a R-2R ladder network and a correction circuit. The R-2R ladder network receives first and second reference voltage terminals and generates an analog voltage at an output terminal in response to a digital input code. The correction circuit, coupled between the first and second reference voltage terminals via a first switch and a second switch respectively, comprises four R resistors, wherein the output terminal is coupled to the junction of the two central R resistors via a third switch, and the first, second and third switches are turned on when the input digital code is half swing.

DESCRIPTION OF THE DRAWINGS

The invention is described by way of exemplary embodiments, but not limitations, illustrated in the accompanying drawings in which like references denote similar elements, and in which.

DETAILED DESCRIPTION

Figure 1:
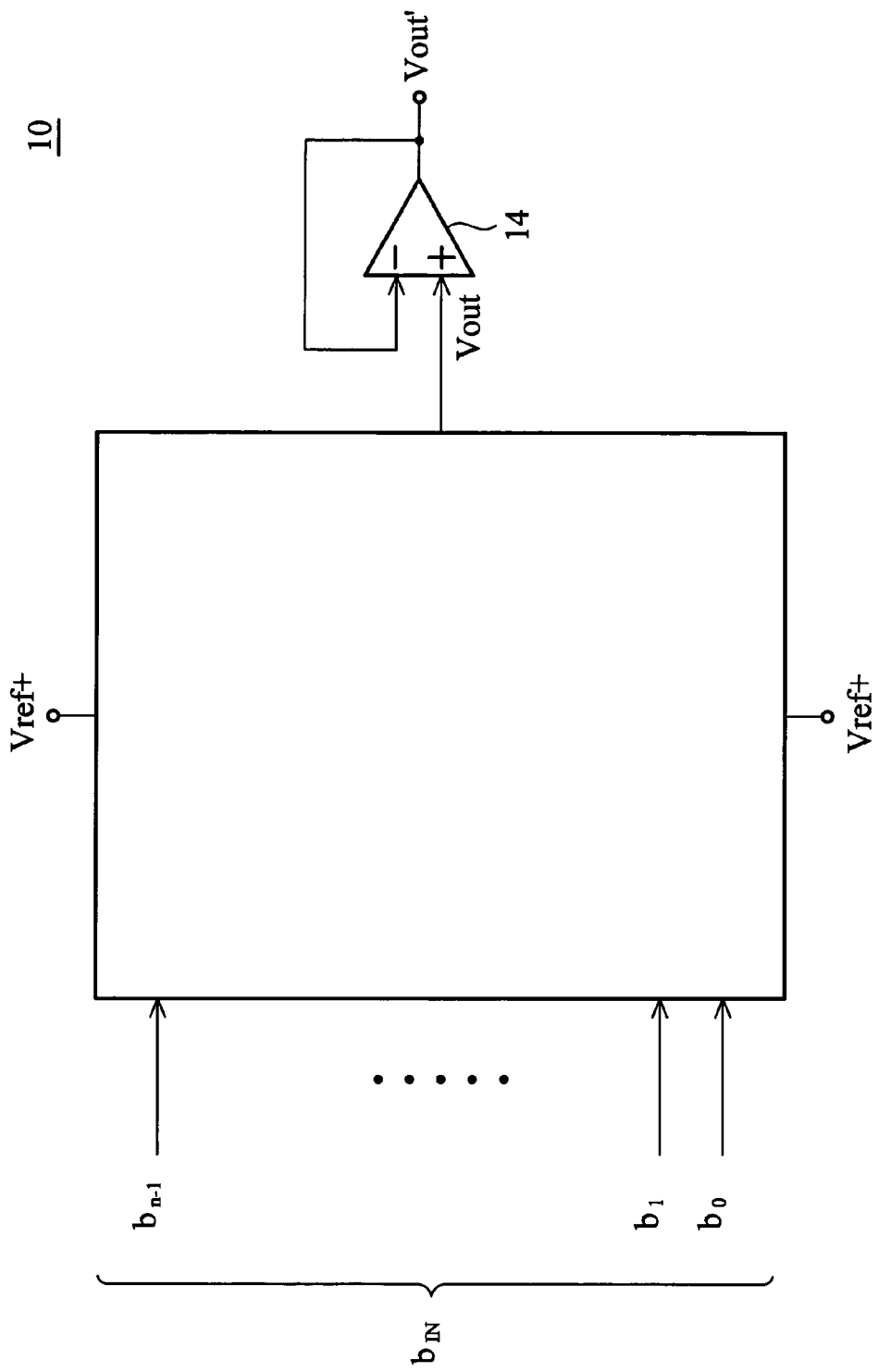
FIG. 1 is a block diagram of a conventional n-bit R-2R D/A converter.
Figure 2:
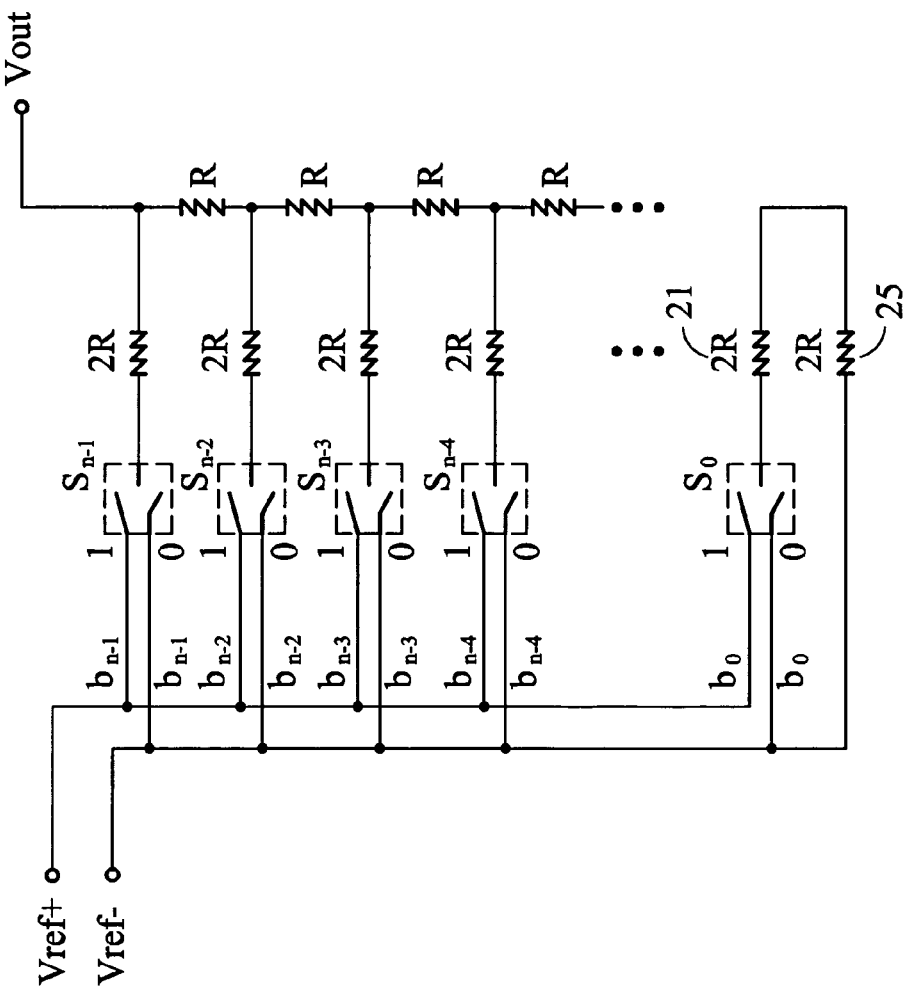
FIG. 2 is a schematic diagram of the R-2R ladder network in FIG. 1.
Figure 5A:
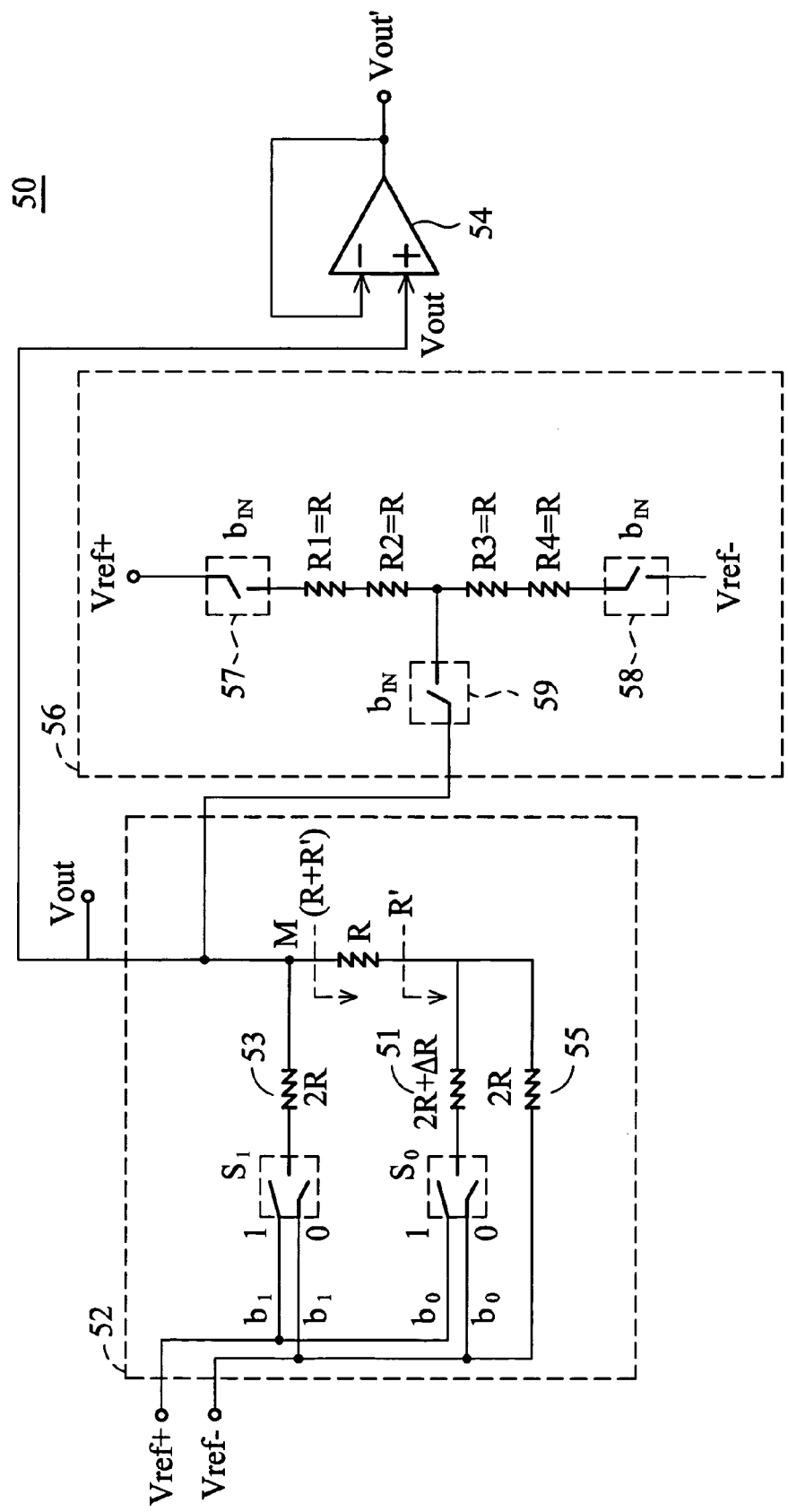
FIG. 5A is a schematic diagram of a 2-bit R/2R D/A converter according to an embodiment of the invention.
Figure 5B:
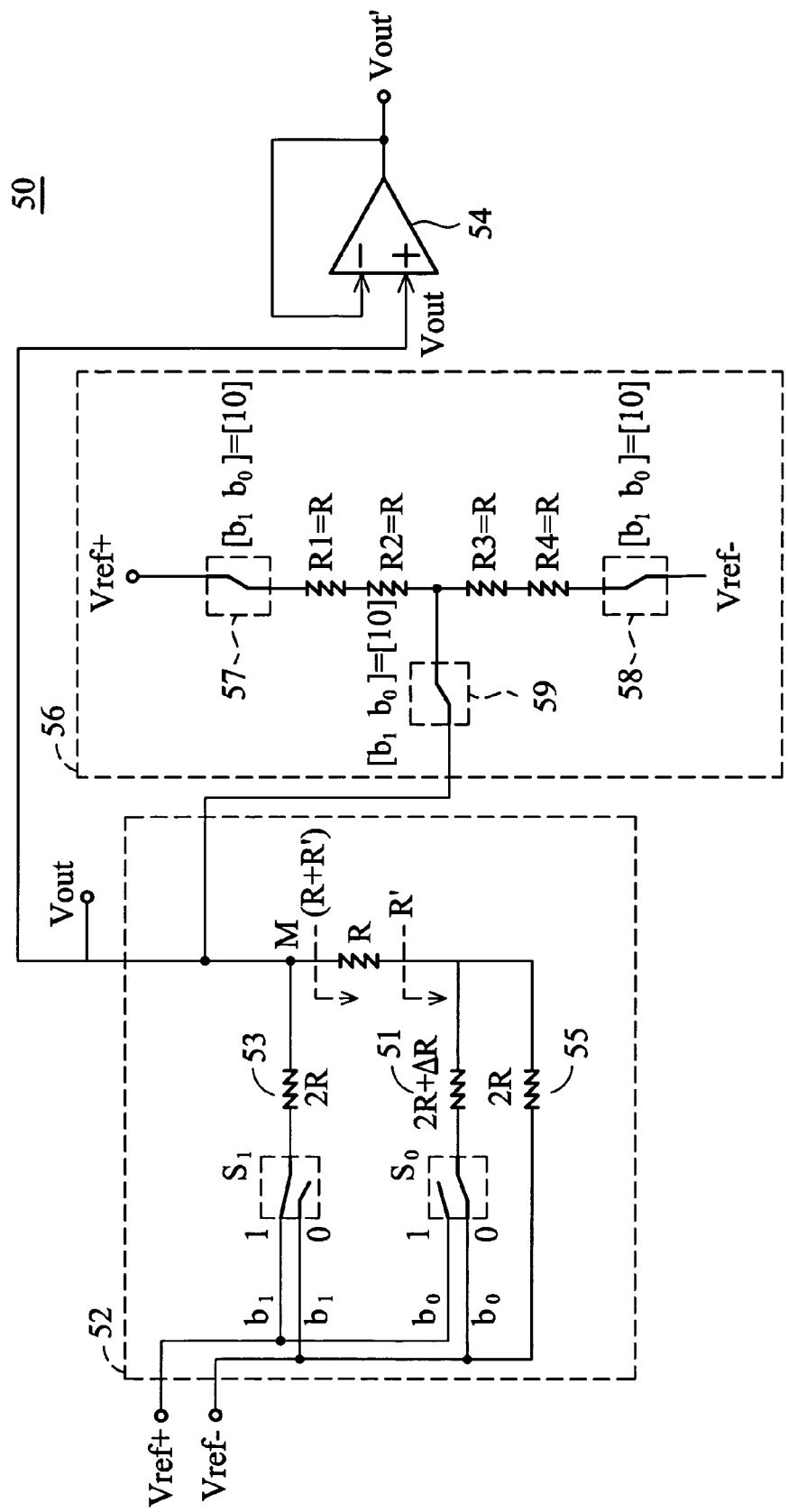
FIG. 5B shows the 2-bit R/2R D/A converter in FIG. 5A with digital input code of [1 0].

FIG. 5A shows a 2-bit R/2R D/A converter 50 according to an embodiment of the invention. The 2-bit R/2R D/A converter 50 comprises a R/2R ladder network 52, a correction circuit 56 and a operational amplifier 54. FIG. 5A is similar to FIG. 1 with FIG. 2 except for the correction circuit 56. The R/2R ladder network 62 and operational amplifier 54 perform the same in FIG. 1 respectively and thus is not described in further detail. The correction circuit 56, coupled between reference voltage terminals, $V_{ref+}$ and $V_{ref-}$, via switches, 57 and 58 respectively, comprises four R resistors, R1–R4, wherein the output terminal is coupled to the injunction between the resistors R2 and R3 via a switch 59. The switches 57–59 are turned on in response to the input digital code $b_{IN}=[b_1\ b_0]$. FIG. 5B shows the 2-bit R/2R D/A converter 50 in FIG. 5A with the input digital code $b_{IN}$ of [1 0]. The switches 57–59 in FIG. 5B are designed to turn on when the input digital code $b_{IN}=[b_1\ b_0]$ is half swing (i.e. [$b_1\ b_0$]=[10]). Since the required element matching ratio between the resistors (R1+R2) and (R3+R4) is 1 and the resistors R1–R4 are just next to each other, it is easier to manufacture the resistors R1–R4 which fulfill the element matching requirement than the resistors in the R/2R ladder network 62. That is the element matching degree of resistors R1–R4 is better than that of resistors in the R/2R ladder network 62 in practice. Thus, by coupling the correction circuit 56, the element mismatch error in the R/2R ladder network 62 is averaged with better element matching degree of the correction circuit 56. The effect of the correction circuit 56 is described as follows with reference to examples.

Figure 3A:
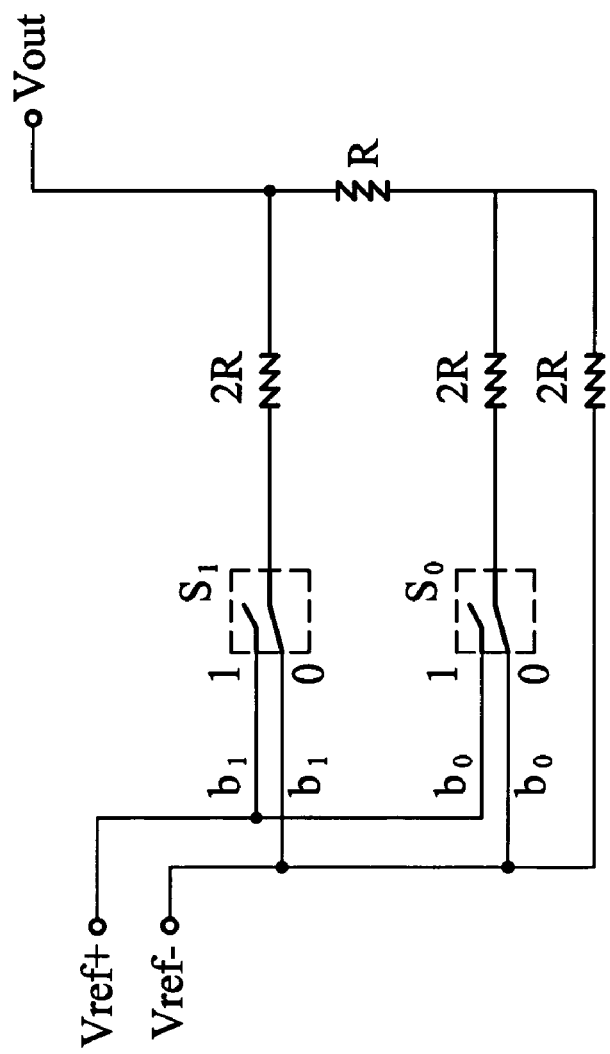
FIGS. 3A and 3B show a 2-bit R-2R ladder network with digital input code of [0 0] and [1 0], respectively.
Figure 3B:
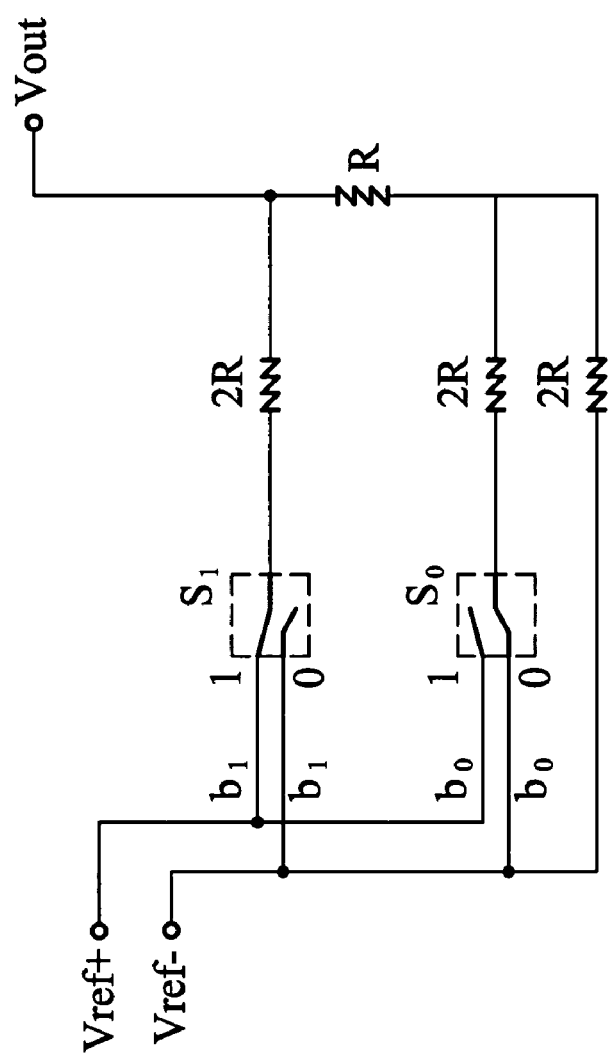
Figure 3C:
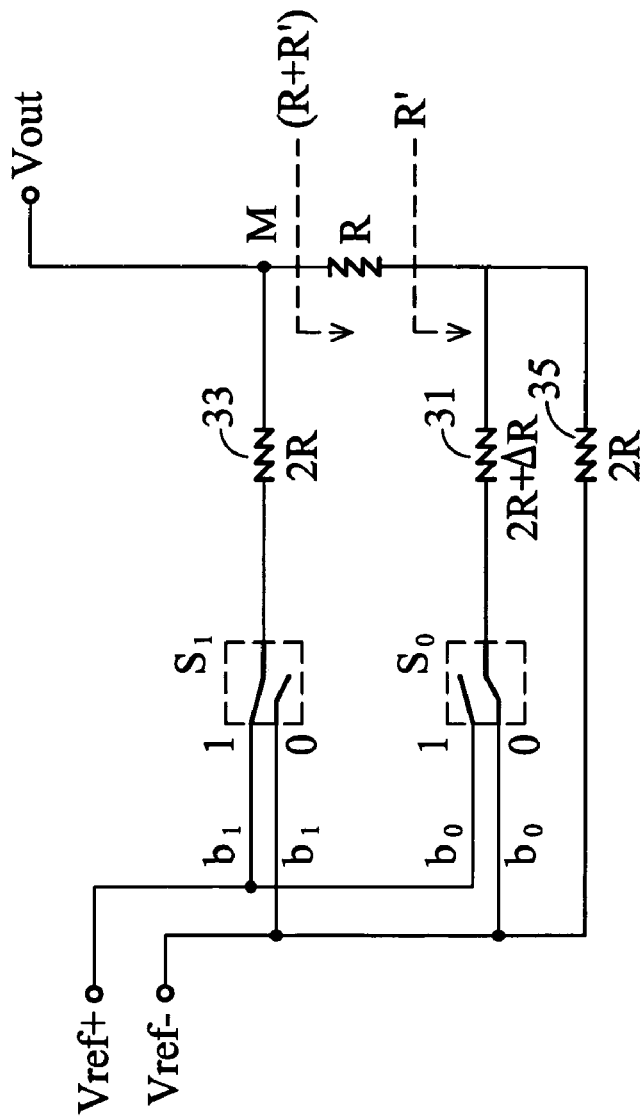
FIG. 3C show a 2-bit R-2R ladder network with digital input code of [1 0] with element mismatch error.

Under the same conditions in FIG. 3C, that is, in the presence of element mismatch in the 2R resistor 51, the resistance of the resistor 51 combining the terminating resistor 55 is R', and the digital code $b_{IN}=[1\ 0]$, the analog output voltage $V_{out}=(V_{ref+}-V_{ref-})*[2R\|(R+R')]/[2R\|2R+2R\|(R'+R)]+V_{ref-}$. Assuming R'=1.01R, the element matching ratio between the resistance of the resistor 53 and the resistance seen from node M is $(2R\|2R)/(2R\|(R+R'))=1/1.0025$ which is 1/1.005 in FIG. 3C. Obviously, the element matching ratio in FIG. 5B is better, thereby improving the output accuracy. Comparison of the two element matching ratios with respect to different R/2R ladder network structure demonstrates the impact of the R/2R ladder network according to an embodiment of the invention stemming from the element mismatch error being reduced by coupling the correction circuit 56.

Figure 6A:
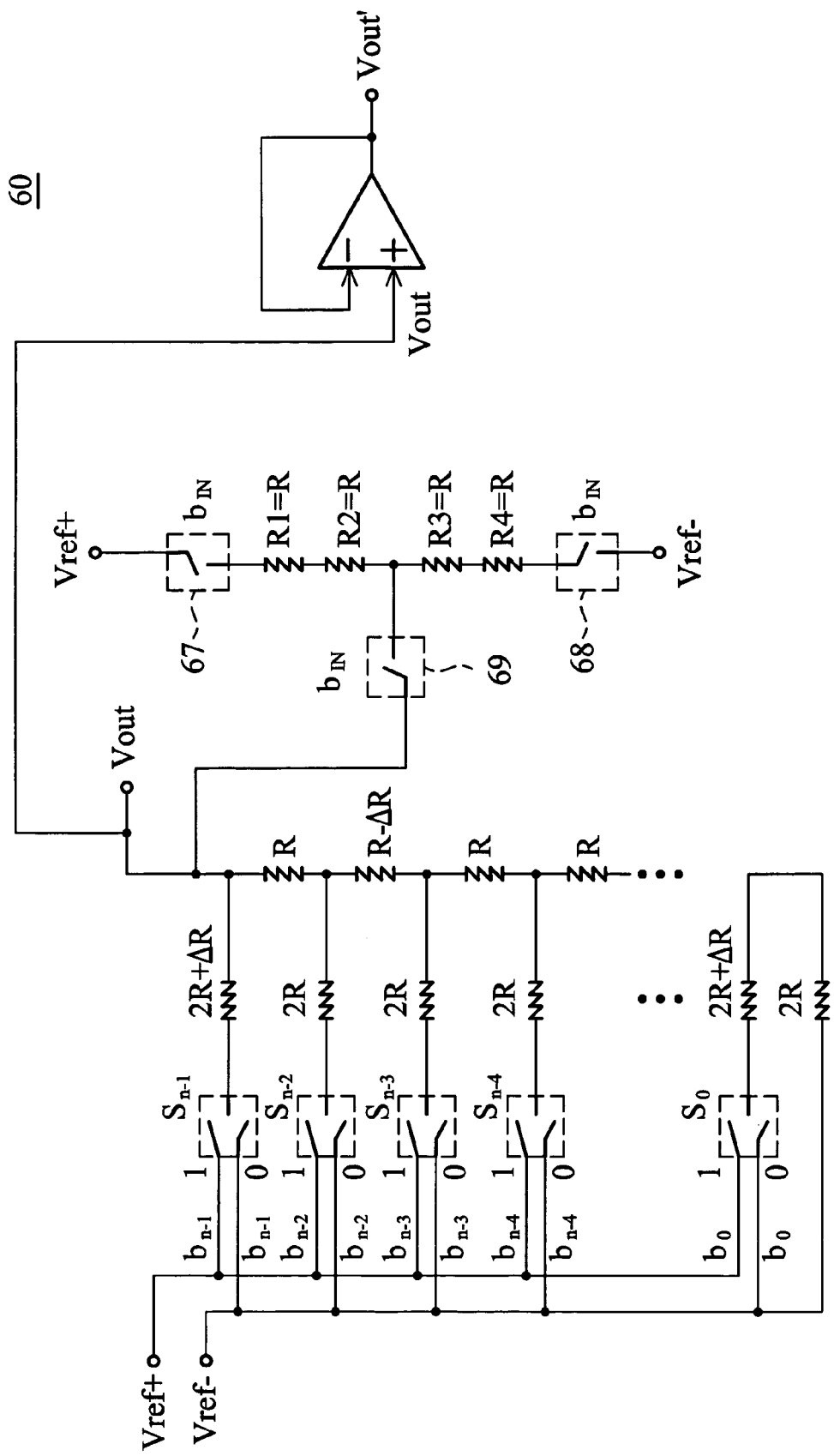
FIG. 6A is a schematic diagram of a n-bit R/2R D/A converter according to an embodiment of the invention.
Figure 6B:
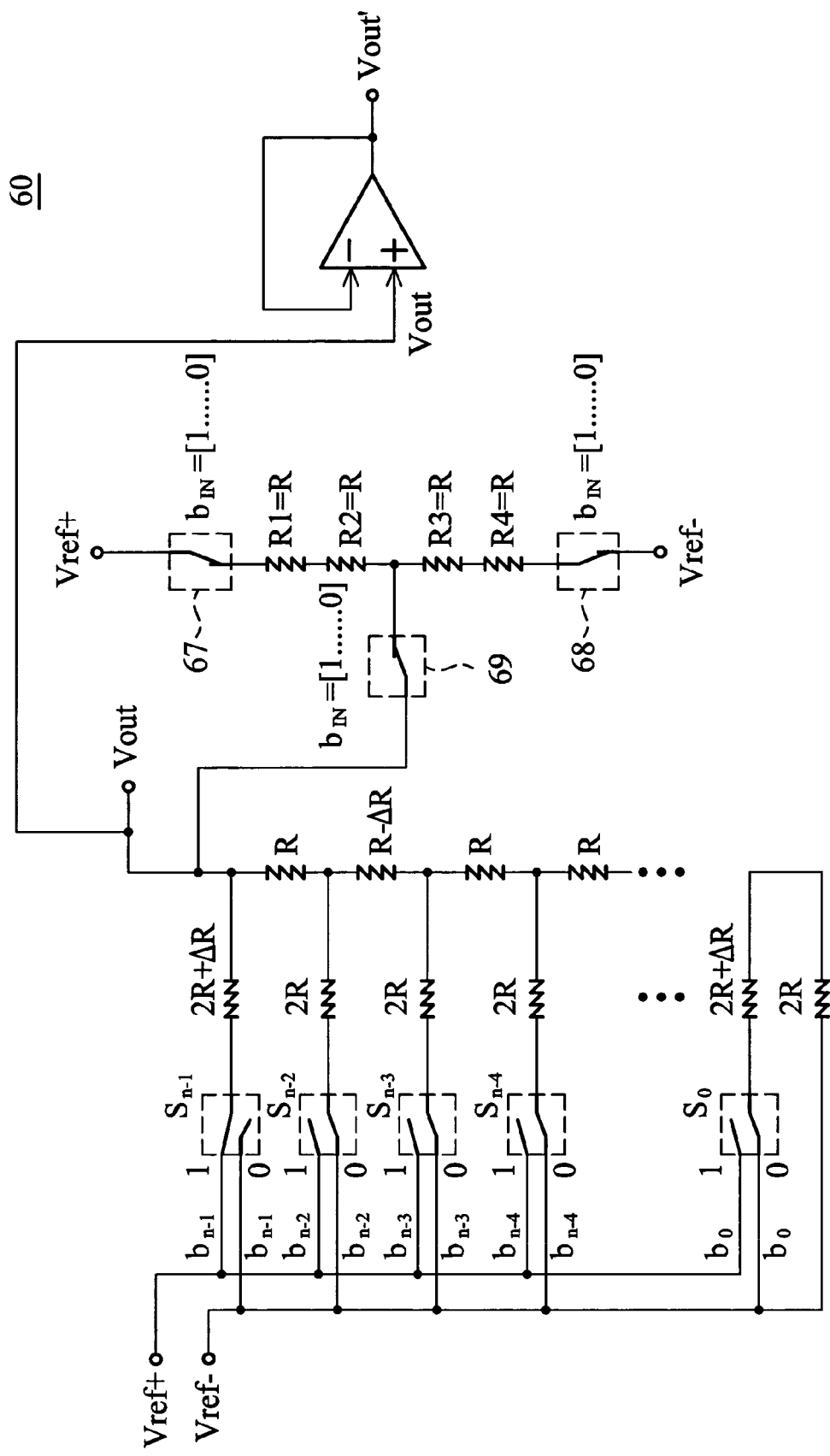
FIG. 6B shows the n-bit R/2R D/A converter in FIG. 6A with digital input code of [100 . . . . . 0].

FIG. 6A shows a n-bit R/2R D/A converter 60 according to an embodiment of the invention. The operation of the R/2R D/A converter 60 is similar to the previous discussion whereas The switches 67–69 herein are turned on in response to the input digital code $b_{IN}=[b_{n-1}\ \ldots\ b_0]$. FIG. 6B shows the n-bit R/2R D/A converter 60 in FIG. 6A with the input digital code $b_{IN}$ of [100 . . . . . 0]. The switches 67–69 in FIG. 6B are designed to turn on when the input digital code $b_{IN}=[_{n-1}\ \ldots\ b_0]$ is half swing (i.e. [$b_{n-1}\ \ldots\ b_0$]=[100 . . . . . 0]), thus reducing the impact of element mismatch error in the n-bit R-2R D/A converter 60. Moreover, the denotation, $\Delta R$, represents the possible element mismatch of the resistors in R/2R D/A converter 60.

Figure 4:
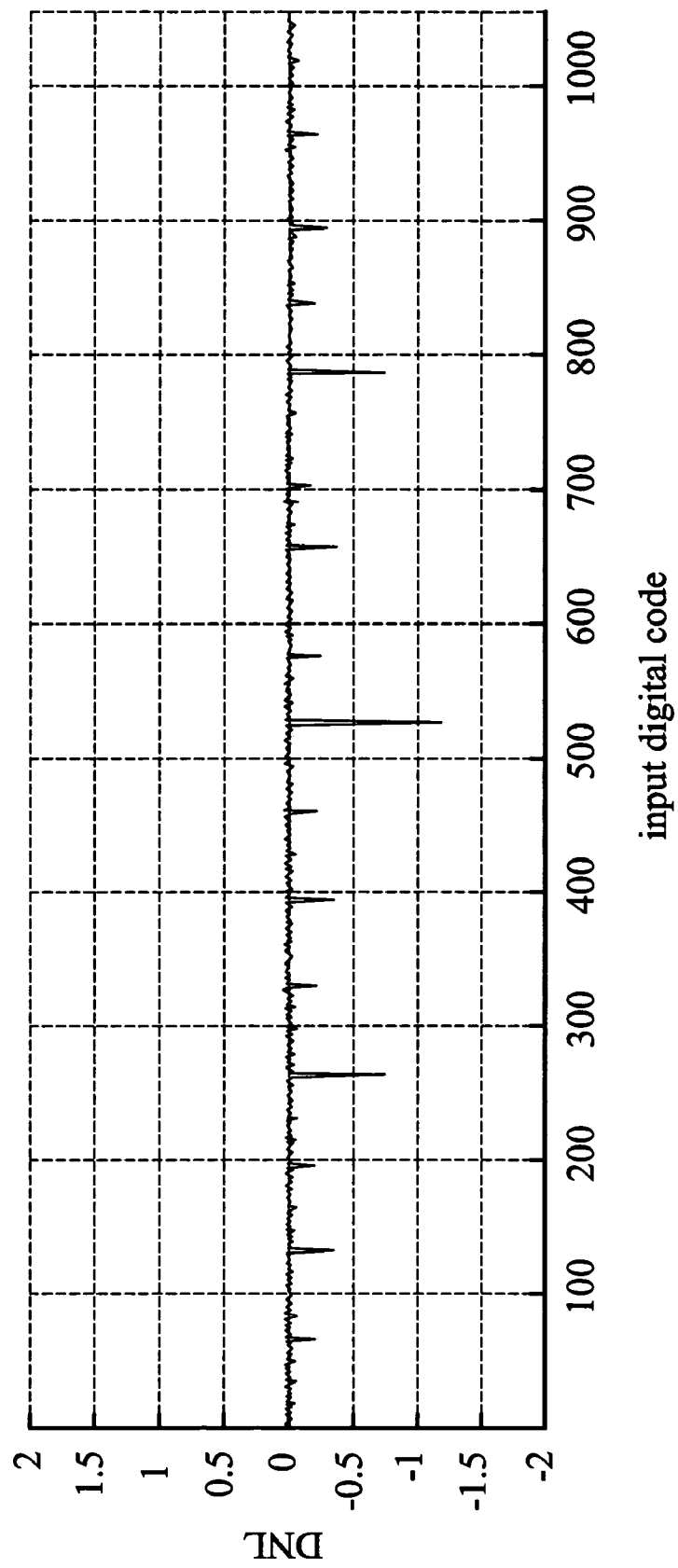
FIG. 4 shows the output DNL of a 10-bit R-2R D/A converter with 1% element mismatch error.
Figure 7:
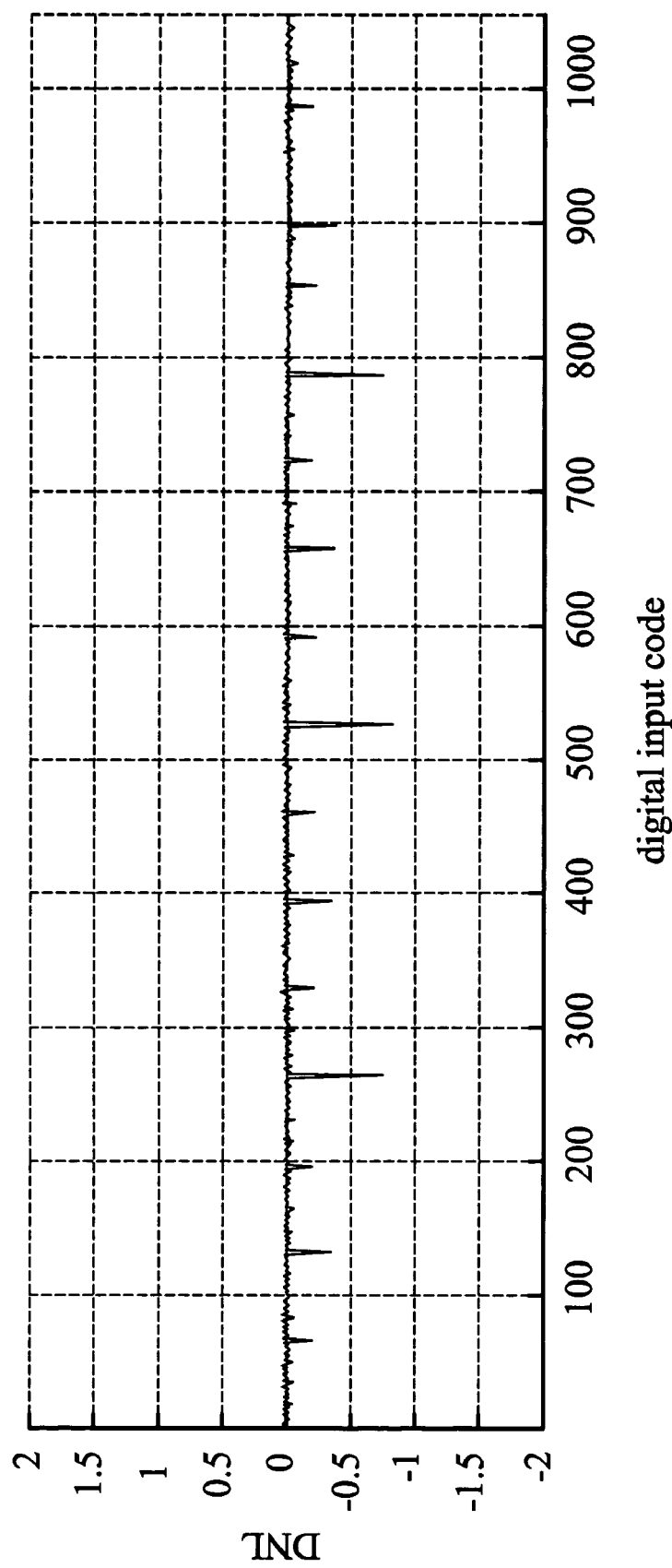
FIG. 7 shows the output DNL of a 10-bit R-2R D/A converter with 1% element mismatch error according to an embodiment of the invention.

FIG. 7 shows the output DNL of a 10-bit R-2R D/A converter with 1% element mismatch error according to an embodiment of the invention. Comparison of FIG. 7 and FIG. 4 demonstrates the DNL of the 10-bit R-2R D/A converter being improved, whereas the non-monotonic phenomenon disappears when the input digital code is half swing (i.e. input code=512).

Those skilled in the art will be familiar with various means of coupling the disclosed correction circuit and controlling the switches according to design necessity, whereby with desired input digital code the output of the of R-2R D/A converters is to be improve. For example, if the circuit design is to reduce the degradation stemming from the element mismatch error when the input digital code is a quarter of the full swing, the switches described in the embodiments of the invention can be adjusted to turn on when the input digital code is a quarter of the full swing and the position of the correction circuit coupling to the output terminal can be changed accordingly.

While the invention has been described by way of example and in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A D/A (digital to analog) converter comprising:
   a R-2R ladder network receiving first and second reference voltage terminals and generating an analog voltage at an output terminal in response to a digital input code; and
   a correction circuit coupled between the first and second reference voltage terminals via a first switch and a second switch respectively, comprising a plurality of R resistors wherein a terminal of one of the R resistors thereof is coupled to the output terminal via a third switch, and the first, second and third switches are turned on in response to the input digital code.

2. The D/A converter of claim 1, wherein the R-2R ladder network comprises:
   a plurality of series R resistors, the last one of which is coupled to a terminating resistor coupled to the first or second reference voltage terminal, and the first one of which is coupled to the output terminal;
   a plurality of parallel 2R resistors respectively coupled to the terminal of each series R resistors, wherein the first of the 2R resistors is coupled to the output terminal and the last of the 2R resistors is coupled to the terminating resistor;
   a plurality of coupling switches, each selectively coupling one corresponding 2R resistor to the first or second reference voltage terminal in response to the input digital code.

3. The D/A converter of claim 2, wherein each coupling switch selectively couples one corresponding 2R resistor to the first or second reference voltage terminal in response to a corresponding digit of the input digital code.

4. The D/A converter of claim 2, wherein the terminating resistor is coupled to the first reference voltage terminal when the voltage at the first reference voltage terminal is less than the voltage at the second reference voltage terminal, or the second reference voltage terminal when the voltage at the second reference voltage terminal is less than the voltage at the second reference voltage terminal.

5. The D/A converter of claim 1, wherein the first, second and third switches are turned on when the input digital code is half swing.

6. The D/A converter of claim 5, wherein the correction circuit comprises four R resistors.

7. The D/A converter of claim 6, wherein the output terminal is coupled to the junction of the two central R resistors in the correction circuit via the third switch.

8. The D/A converter of claim 1, further comprising an operational amplifier, comprising a positive input coupled to the output terminal, a negative input and an output coupled to the negative input.

9. A D/A (digital-to-analog) converter comprising:
   a R-2R ladder network receiving first and second voltage terminals, and generating an analog voltage signal at an output terminal in response to a digital input code; and
   a correction circuit coupled between the first and second reference voltage terminals via a first switch and a second switch respectively, comprising a plurality of R resistors wherein a terminal of one of the R resistors is coupled to the output terminal via a third switch, and the first, second and third switches are turned on when the input digital code is half swing.

10. The D/A converter of claim 9, wherein the R-2R ladder network comprises:
    a plurality of series R resistors, the last one of which is coupled to a terminating resistor coupled to the first or second reference voltage terminal and the first one of which is coupled to the output terminal;
    a plurality of parallel 2R resistors respectively coupled to the terminal of each series R resistors, wherein the first of the 2R resistors is coupled to the output terminal and the last of the 2R resistors is coupled to the terminating resistor;
    a plurality of coupling switches, each selectively coupling one corresponding 2R resistor to the first reference or second voltage terminal in response to the input digital code.

11. The D/A converter of claim 10, wherein each coupling switch selectively couples one corresponding 2R resistor to the first or second reference voltage terminal in response to a corresponding digit of the input digital code.

12. The D/A converter of claim 10, wherein the terminating resistor is coupled to the first reference voltage terminal when the voltage at the first reference voltage terminal is less than the voltage at the second reference voltage terminal, or the second reference voltage terminal when the voltage at the second reference voltage terminal is less than the voltage at the second reference voltage terminal.

13. The D/A converter of claim 10, wherein the correction circuit comprises four R resistors.

14. The D/A converter of claim 13, wherein the output terminal is coupled to the junction of the two central R resistors in the correction circuit via the third switch.

15. A D/A (digital to analog) converter comprising:
    a R-2R ladder network receiving first and second voltage terminals and generating an analog voltage signal at an output terminal in response to a digital input code; and
    a correction circuit coupled between the first and second reference voltage terminals via a first switch and a second switch respectively, comprising four R resistors wherein the output terminal is coupled to the junction of the two central R resistors via a third switch, and the first, second and third switches are turned on when the input digital code is half swing.

16. The D/A converter of claim 15, wherein the R-2R ladder network comprises:
    a plurality of series R resistors, the last one of which is coupled to a terminating resistor coupled to the first or second voltage terminal and the first one of which is coupled to the output terminal;
    a plurality of parallel 2R resistors respectively coupled to the terminal of each series R resistor, wherein the first of the 2R resistors is coupled to the output terminal and the last of the 2R resistors is coupled to the terminating resistor;
    a plurality of coupling switches, each selectively coupling one corresponding 2R resistor to the first or second reference voltage terminal in response to the input digital code.

17. The D/A converter of claim 16, wherein each coupling switch selectively couples one corresponding 2R resistor to the first or second reference voltage terminal in response to a corresponding digit of the input digital code.

18. The D/A converter of claim 16, wherein the terminating resistor is coupled to the first reference voltage terminal when the voltage at the first reference voltage terminal is less than the voltage at the second reference voltage terminal, or the second reference voltage terminal when the voltage at the second reference voltage terminal is less than the voltage at the second reference voltage terminal.

19. The D/A converter of claim 15, wherein the D/A converter further comprises an operational amplifier, wherein the positive input thereof is coupled to the output terminal and the output thereof is coupled back to the negative input thereof.

* * * * *